United States Patent
Kwon et al.

(10) Patent No.: US 8,537,917 B2
(45) Date of Patent: Sep. 17, 2013

(54) APPARATUS AND METHOD FOR MAPPING SYMBOL

(75) Inventors: Dong Seung Kwon, Daejeon (KR); Byung-Jae Kwak, Seoul (KR); Bum-Soo Park, Daejeon (KR); Choong Il Yeh, Daejeon (KR); Young Seog Song, Daejeon (KR); Seung Joon Lee, Daejeon (KR); Ji Hyung Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 400 days.

(21) Appl. No.: 12/922,083

(22) PCT Filed: Mar. 10, 2009

(86) PCT No.: PCT/KR2009/001179
§ 371 (c)(1),
(2), (4) Date: Sep. 10, 2010

(87) PCT Pub. No.: WO2009/113792
PCT Pub. Date: Sep. 17, 2009

(65) Prior Publication Data
US 2011/0026628 A1 Feb. 3, 2011

(30) Foreign Application Priority Data
Mar. 10, 2008 (KR) .................. 10-2008-0021882
Apr. 18, 2008 (KR) .................. 10-2008-0036042
Jan. 19, 2009 (KR) .................. 10-2009-0004301

(51) Int. Cl.
*H04L 23/02* (2006.01)

(52) U.S. Cl.
USPC .......... 375/261; 375/260; 375/262; 375/265; 375/295; 375/298; 714/751; 714/752; 714/794; 714/795; 714/796; 455/39; 455/73; 455/91; 329/304

(58) Field of Classification Search
USPC ............... 375/260, 261, 262, 265, 295, 298; 714/751, 752, 794, 795, 796; 455/39, 73, 455/91; 329/304
See application file for complete search history.

(56) References Cited

U.S. PATENT DOCUMENTS

| | | | |
|---|---|---|---|
| 7,496,079 | B2 | 2/2009 | Kim et al. |
| 7,512,843 | B2 | 3/2009 | Kim et al. |
| 2003/0081690 | A1 | 5/2003 | Kim et al. |
| 2005/0193307 | A1 | 9/2005 | Wengerter et al. |
| 2006/0133533 | A1 | 6/2006 | Khandekar et al. |
| 2006/0156172 | A1 | 7/2006 | Kim et al. |
| 2007/0002969 | A1 | 1/2007 | Jeong et al. |
| 2007/0260958 | A1 | 11/2007 | Li et al. |

FOREIGN PATENT DOCUMENTS

| | | |
|---|---|---|
| KR | 10-2003-0001188 | 1/2003 |
| KR | 10-2006-0060520 | 6/2006 |
| KR | 10-2006-0130879 | 12/2006 |
| WO | WO 02/067491 | 8/2002 |
| WO | WO 03/049397 | 6/2003 |

OTHER PUBLICATIONS

CH. Wengerter, et al., Advanced Hybrid ARQ Technique Employing a Signal Constellation Rearrangement, Proceedings of IEEE Vehicular Technology Conference, p. 2002-2006 vol. 4, Sep. 2002.

*Primary Examiner* — Leon Flores
(74) *Attorney, Agent, or Firm* — Staas & Halsey LLP

(57) ABSTRACT

In a symbol mapping method, transmission data is encoded to generate information bits and redundancy bits. An average LLR value of bits on which the information bits are mapped is different from an average LLR value of bits on which the redundancy bits are mapped.

18 Claims, 6 Drawing Sheets

APPARATUS AND METHOD FOR MAPPING SYMBOL

CROSS REFERENCE TO RELATED APPLICATIONS

This application claims the benefit of International Application No. PCT/KR2009/001179, filed Mar. 10, 2009, and claims the benefit of Korean Application No. 10-2008-0021882, filed Mar. 10, 2008, Korean Application No. 10-2008-0036042, filed Apr. 18, 2008, and Korean Application No. 10-2009-0004301, filed Jan. 19, 2009, the disclosures of all of which are incorporated herein by reference.

TECHNICAL FIELD

The present invention relates to a symbol mapping method and apparatus.

BACKGROUND ART

When information of binary bit streams is encoded by a systematic encoder, the encoded code has a format in which redundancy bits are added to information bits prior to being encoded. An example of the systematic encoder is a convolutional turbo code (CTC).

Quadrature amplitude modulation (QAM) from among the modulation methods converts a plurality of bits of transmission data into phase and amplitude information of a symbol and transmits the same. 16 QAM can transmit 4 bits with a symbol, and 64 QAM can transmit 6 bits with a symbol.

The 16 QAM is a method for dividing the data to be transmitted into 4-bit units, mapping each of the units on one of 16 symbols, modulating them, and transmitting them, and it generally uses the gray mapping for the symbol mapping method. When the 4-bit symbol that is modulated by the gray mapping is received, the bits of the received symbol respectively have different reliability. For example, the reliability of the received bits can be shown as log likelihood ratio (LLR) values.

The conventional art degrades received performance since it maps the symbol without distinguishing reliability differences, information bits, and redundancy bits.

The above information disclosed in this Background section is only for enhancement of understanding of the background of the invention and therefore it may contain information that does not form the prior art that is already known in this country to a person of ordinary skill in the art.

DISCLOSURE

Technical Problem

Embodiments of the present invention provide a symbol mapping method and apparatus for improving receiving performance.

Technical Solution

An embodiment of the present invention provides a method of mapping transmission data on a symbol in a symbol mapping apparatus. The method includes: encoding the transmission data to output a plurality of information bits and a plurality of redundancy bits; interleaving the information bits to output an information block: interleaving the redundancy bits to output a redundancy block; and mapping bits of the information block and bits of the redundancy block on a symbol according to reliability.

The reliability may be greater as the average log likelihood ratio (LLR) value becomes greater.

Reliability of bits on which the information block is mapped may be different from reliability of bits on which the redundancy block is mapped.

Another embodiment of the present invention provides a symbol mapping apparatus including an encoder, a first interleaver, a second interleaver, and a symbol mapper. The encoder encodes transmission data. The first interleaver outputs a plurality of information bits by interleaving an information part from among the output from the encoder, and the second interleaver outputs a plurality of redundancy bits by interleaving a redundancy part from among the output from the encoder. The symbol mapper maps the information bits and the redundancy bits on the symbol according to the log likelihood ratio (LLR).

The symbol mapper may allocate at least part of the information bits to the first bits of the respective symbols, and may allocate at least part of the redundancy bits to the second bits of the respective symbols. The first bits and the second bits may respectively have a different average LLR value.

MODE FOR INVENTION

In the following detailed description, only certain embodiments of the present invention have been shown and described, simply by way of illustration. As those skilled in the art would realize, the described embodiments may be modified in various different ways, all without departing from the spirit or scope of the present invention. To clarify the present invention, parts that are not related to description are omitted, and the same parts have the same drawing sequences through the entire specification.

In the specification, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

The reliability of respective bits in the symbol when modulating the transmission data will now be described with reference to FIG. 1 and FIG. 2.

Figure 1:
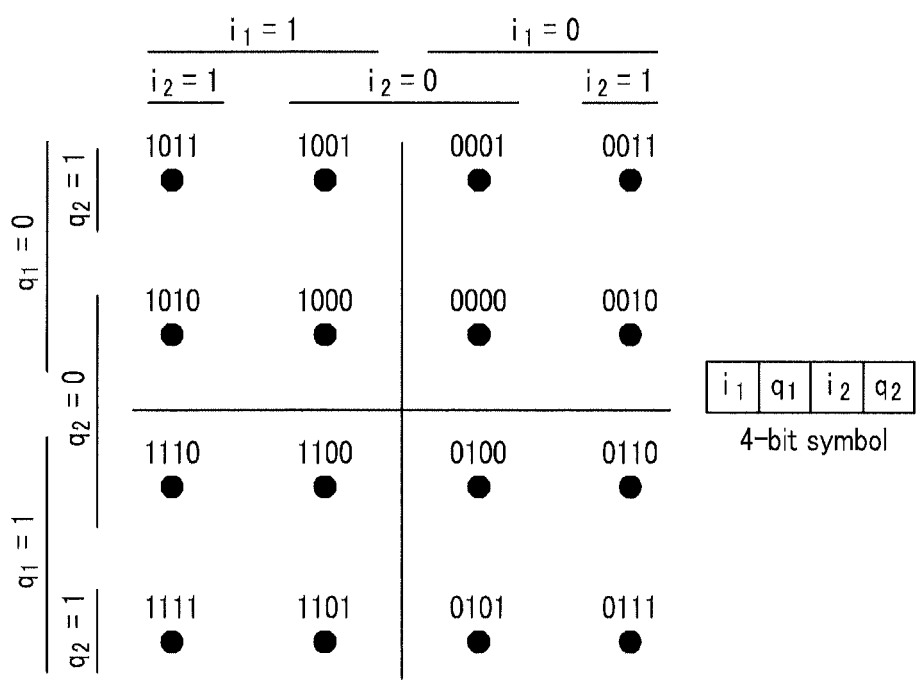
FIG. 1 and FIG. 2 respectively show examples of 16 QAM gray mapping.
Figure 2:
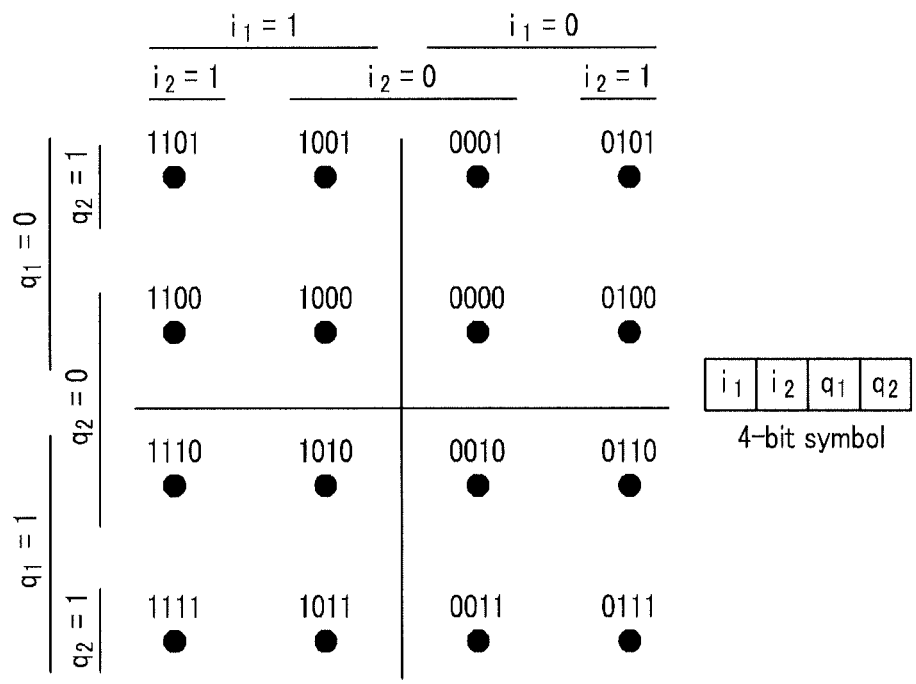

FIG. 1 shows an example of 16-QAM gray mapping, and FIG. 2 shows another example of 16 QAM gray mapping. FIG. 1 and FIG. 2 will use 16 QAM as an example of modulation, gray mapping as an example of symbol mapping, and LLR as an example of reliability.

Referring to FIG. 1 and FIG. 2, in the gray mapping, 1 bit value is different between adjacent symbols and other bit values are the same. A plurality of gray mappings can be provided for one 16-QAM constellation, and FIG. 1 and FIG. 2 show two different gray mappings for one QAM constellation. That is, the 4 bits are provided in the order of $i_1$, $q_1$, $i_2$, and $q_2$ in the symbol of FIG. 1, and the 4 bits are provided in the order of $i_1$, $i_2$, $q_1$, and $q_2$ in the symbol of FIG. 2.

Table 1 shows the average LLR of the first bit ($i_1$) and the average LLR of the second bit ($i_2$) from among the bits mapped as in-phase components of the QAM symbol by gray mapping shown in FIG. 1.

TABLE 1

| Symbol ($i_1q_1i_2q_2$) | Average of x | LLR of $i_1$ | LLR of $i_2$ |
|---|---|---|---|
| $0q_10q_2$ | $x_0$ | $-4Kx_0^2 = -\Lambda$ | $-4Kx_0^2 = -\Lambda$ |
| $0q_11q_2$ | $x_1$ | $-12Kx_0^2 = -3\Lambda$ | $4Kx_0^2 = \Lambda$ |
| $1q_10q_2$ | $-x_0$ | $4Kx_0^2 = \Lambda$ | $-4Kx_0^2 = -\Lambda$ |
| $1q_11q_2$ | $-x_1$ | $12Kx_0^2 = 3\Lambda$ | $4Kx_0^2 = \Lambda$ |

Here, x is a coordinate of the x axis (i.e., horizontal axis) of the received symbol, $-x_1$, $-x_0$, $x_0$, and $x_1$ represent coordinates of four x's in the direction from the left to the right in FIG. 1, the average of x is provided assuming that received noise is white noise with the average 0, and K is a constant.

In Table 1, it can be known that the average LLR value of the first bit $i_1$ from among the bits mapped as in-phase components is substantially twice the average LLR value of the second bit $i_2$. In a like manner, the average LLR value of the first bit $q_1$ from among the bits mapped as quadrature components is substantially twice the average LLR value of the second bit $q_2$. Therefore, the average LLR value and reliability of the respective bits of 16 QAM are variable by locations.

In the case of 64 QAM, in a like manner of 16 QAM, the average LLR value of a plurality of bits in the QAM symbol is changeable according to the location.

A symbol mapping method according to an embodiment of the present invention will now be described with reference to FIGS. 3 to 7.

Figure 3:
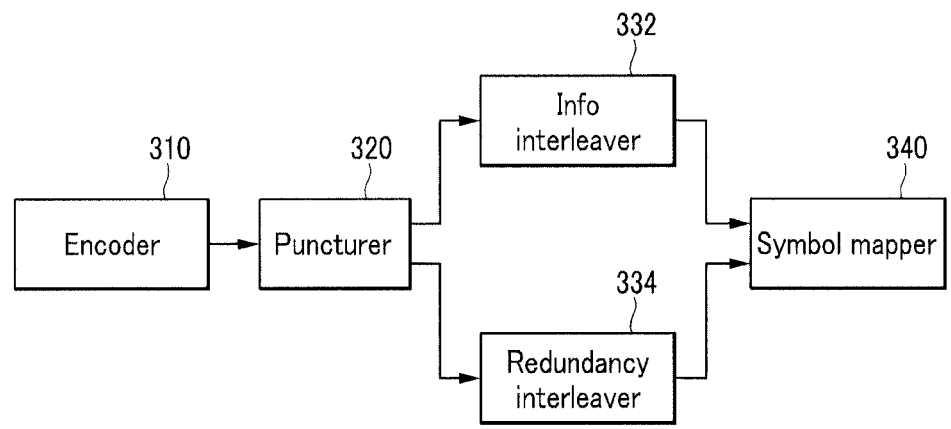
FIG. 3 shows a block diagram of a symbol mapping apparatus according to an embodiment of the present invention.
Figure 4:
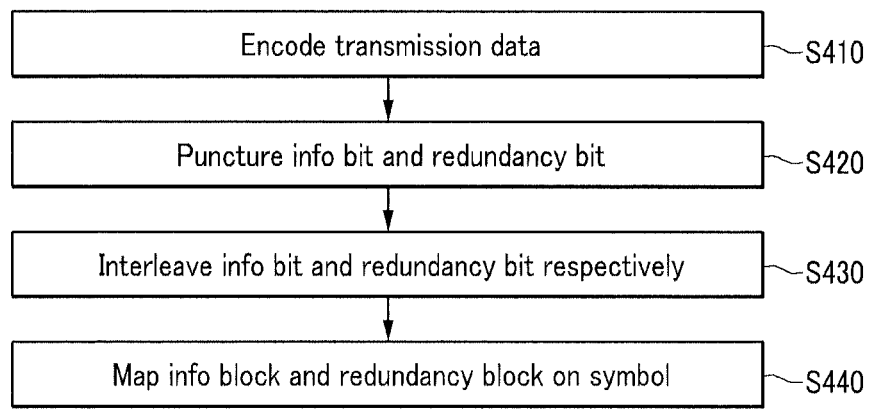
FIG. 4 shows a flowchart of a symbol mapping method according to an embodiment of the present invention.

FIG. 3 shows a block diagram of a symbol mapping apparatus according to an embodiment of the present invention, and FIG. 4 shows a flowchart of a symbol mapping method according to an embodiment of the present invention.

Referring to FIG. 3, a symbol mapping apparatus according to an embodiment of the present invention includes an encoder 310, a puncturer 320, an information interleaver 332, a redundancy interleaver 334, and a symbol mapper 340.

Referring to FIG. 4, the encoder 310, for example a systematic encoder, encodes transmission data (S410). The encoder 310 outputs data in which a plurality of redundancy bits are added to a plurality of information bits. The puncturer 320 punctures the information bits and the redundancy bits (S420). Here, the puncturer 320 can puncture the redundancy bits and not the information bits. The information interleaver 332 interleaves the punctured information bits, and the redundancy interleaver 334 interleaves the punctured redundancy bits (S430). The symbol mapper 340 maps the interleaved information bits (referred to as an "information block") and the interleaved redundancy bits (referred to as a "redundancy block") on the symbols (S440).

Figure 5:
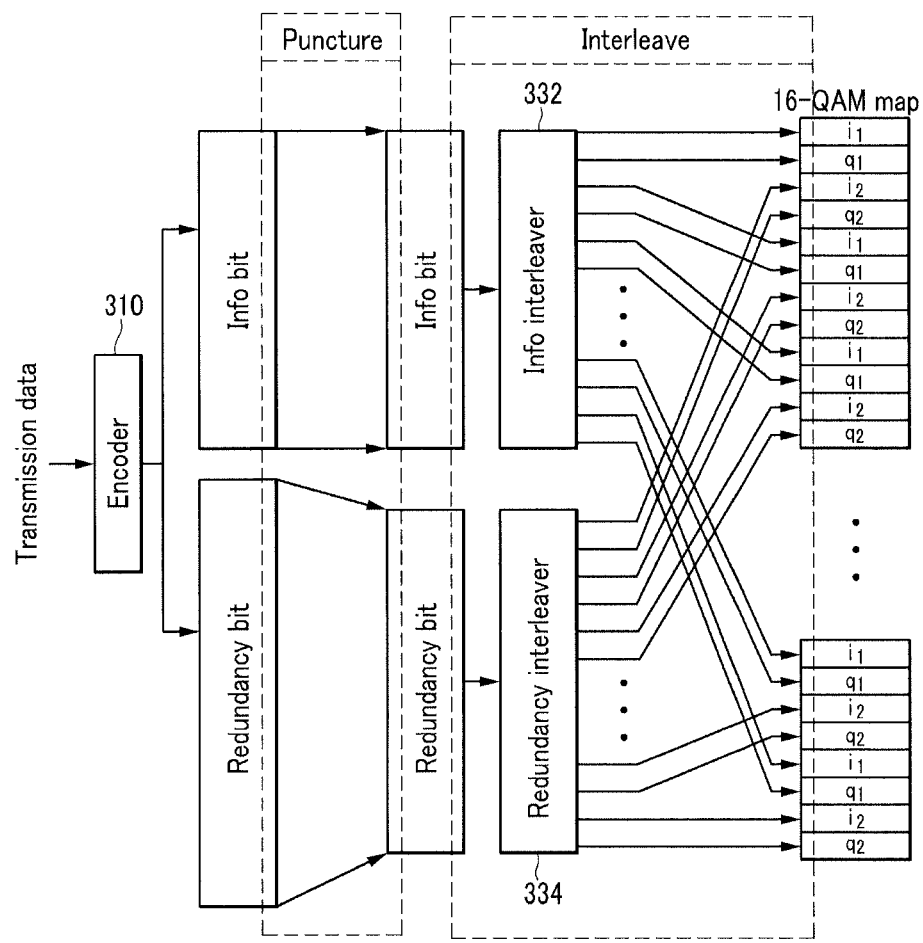
FIG. 5 and FIG. 6 respectively show an example of symbol mapping according to an embodiment of the present invention.
Figure 6:
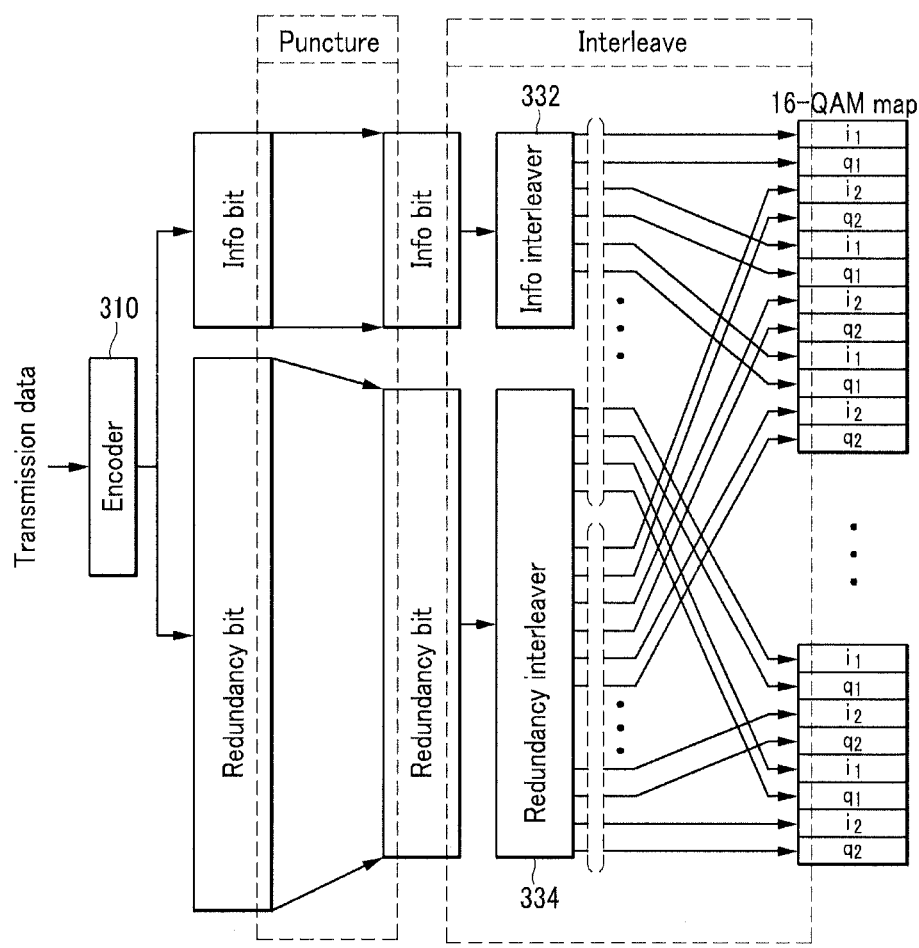

FIG. 5 and FIG. 6 respectively show an example of symbol mapping according to an embodiment of the present invention.

Referring to FIG. 5, when the encoding rate of the encoder 310 is ½, the number of information bits and the number of redundancy bits output to the encoder 310 are the same. The symbol mapper 340 maps bits of the information block on the bits $i_1$ and $q_1$ of the 16 QAM symbol, and it maps bits of the redundancy block on the bits $i_2$ and $q_2$ of the 16 QAM symbol. Accordingly, the symbol mapper 340 maps the information block bits on the bits $i_1$ and $q_1$ with a large average LLR value that is high reliability and the redundancy block bits on the bits $i_2$ and $q_2$ with a small average LLR value that is less reliability to thus increase reliability of the information block bits to be greater than that of the redundancy block bits.

Referring to FIG. 6, when the encoding rate of the encoder 310 is less than ½ (e.g., the encoding rate is ⅓), the number of redundancy bits output by the encoder 310 is greater than the number of information bits. The symbol mapper 340 maps some bits of the redundancy block together with the bits of the information block and separately maps other bits of the redundancy block. That is, the symbol mapper 340 maps some bits of the redundancy block on the bits $i_1$ and $q_1$ with high reliability.

In another embodiment, when the encoding rate is greater than ½, the number of information bits is greater than the number of redundancy bits. In this case, the symbol mapper 340 maps some bits of the information block together with the redundancy block bits, and maps the other bits of the information block separately.

In the embodiment shown in FIG. 5 and FIG. 6, the symbol mapper 340 has been described to map the information block bits on the bits $i_1$ and $q_1$ with a great LLR value, and the redundancy block bit on the bits $i_2$ and $q_2$ with a low LLR value. In another embodiment, it is possible for the symbol mapper 340 to map the redundancy block bit on the bits $i_1$ and $q_1$ with a large LLR value, and the information block bits on the bits $i_2$ and $q_2$ with a low LLR value.

Figure 7:
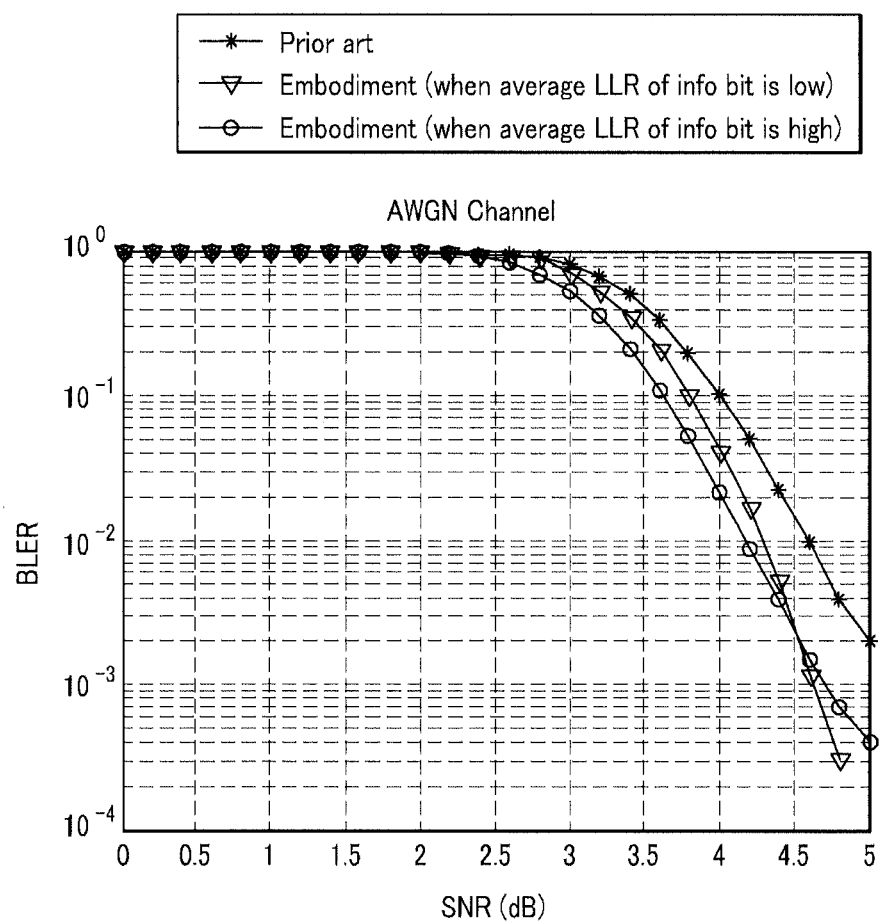
FIG. 7 shows performance of a symbol mapping method according to an embodiment of the present invention.

FIG. 7 shows performance of a symbol mapping method according to an embodiment of the present invention.

FIG. 7 shows a block error rate (BLER) with respect to a signal-to-noise ratio (SNR) in an additive white Gaussian noise (AWGN) channel in the case of using the convolutional turbo code with the encoding rate of ⅓ in the 16-QAM orthogonal frequency division multiplexing (OFDM) system.

As shown in FIG. 7, the BLER in the case of symbol mapping the average LLR value of the information block to be greater than the average LLR value of the redundancy block or symbol mapping the average LLR value of the information block to be less than the average LLR value of the redundancy block in a like manner of the symbol mapping method according to the embodiment of the present invention is shown to be less than the BLER according to the symbol mapping method considering no LLR value.

The 16 QAM having four bits ($i_1$, $q_1$, $i_2$, $q_2$) for each symbol has been described in the embodiment of the present invention, and the symbol mapping method according to the embodiment of the present invention is applicable to other modulation methods as well as the 16 QAM method.

For example, the $2^{2n}$ QAM has 2n bits ($i_1$, $i_2$, ..., $i_n$, $q_1$, $q_2$, ..., $q_n$) for each symbol, and the LLR values of the respective bits are different. In this case, as described with reference to FIG. 5 and FIG. 6, the symbol mapper maps one of the information block and the redundancy bit on the bit with the relatively greater LLR value from among the 2n bits, and maps the other one to the bit with the relatively less LLR value.

As described above, according to the embodiments of the present invention, performance can improved by mapping the symbol so that reliability of the information bits may be different from that of the redundancy bits.

The above-described embodiments can be realized through a program for realizing functions corresponding to the configuration of the embodiments or a recording medium for recording the program in addition to through the above-described apparatus and/or method, which is easily realized by a person skilled in the art.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. A method of mapping transmission data on a symbol in a symbol mapping apparatus, the method comprising: encoding the transmission data to output a plurality of information bits and a plurality of redundancy bits; interleaving the information bits to output an information block: interleaving the redundancy bits to output a redundancy block; and mapping bits of the information block and bits of the redundancy block on a symbol according to reliability, wherein the reliability is greater as the average log likelihood ratio (LLR) value is increased, wherein the encoding, interleaving, and mapping are performed by one or more processors.

2. The method of claim 1, wherein the information bits are interleaved separately from the redundancy bits.

3. The method of claim 1, wherein reliability of bits on which the information block is mapped is different from reliability of bits on which the redundancy block is mapped.

4. The method of claim 1, wherein the mapping bits comprises:
mapping the bits of the information block on a plurality of first bits; and
mapping the bits of the redundancy block on a plurality of second bits,
wherein reliability of the first bits is greater than that of the second bits.

5. The method of claim 1, wherein the mapping bits comprises:
mapping the bits of the information block on a plurality of first bits; and
mapping the bits of the redundancy block on a plurality of second bits,
wherein reliability of the first bits is less than that of the second bits.

6. The method of claim 1, wherein the mapping bits comprises:
mapping some bits from among the bits of the first block and bits of the second block on a plurality of first bits; and
mapping remaining bits of the first block on a plurality of second bits,
wherein reliability of the first bits is greater than that of the second bits, and the first block is a block having a greater number of bits from among the information block and the redundancy block, and the second block is a block having a lesser number of bits.

7. The method of claim 1, wherein the mapping bits comprises:
mapping some bits from among the bits of the first block and bits of the second block on a plurality of first bits; and
mapping remaining bits of the first block on a plurality of second bits,
wherein reliability of the first bits is less than that of the second bits, and the first block is a block having a greater number of bits from among the information block and the redundancy block, and the second block is a block having a lesser number of bits.

8. The method of claim 1, further comprising puncturing the redundancy bit before interleaving the information bits and the redundancy bits.

9. A symbol mapping apparatus comprising: an encoder that encodes transmission data; a first interleaver that outputs a plurality of information bits by interleaving an information part from among the output from the encoder; a second interleaver that outputs a plurality of redundancy bits by interleaving a redundancy part from among the output from the encoder; and a symbol mapper that maps the information bits and the redundancy bits on the symbol according to the log likelihood ratio (LLR), wherein the symbol mapper allocates at least part of the information bits to the first bits of the respective symbols, and allocates at least part of the redundancy bits to the second bits of the respective symbols, wherein the first bits have an average LLR value that is greater than that of the second bits, and wherein the encoder, first interleaver, second interleaver, and symbol mapper are incorporated in one or more processors.

10. The symbol mapping apparatus of claim 9, wherein the encoder includes a systematic encoder.

11. The symbol mapping apparatus of claim 9, wherein the encoder has an encoding rate of ½, and
the symbol mapper allocates the information bits to the first bits of the respective symbols, and allocates the redundancy bits to the second bits of the respective symbols.

12. The symbol mapping apparatus of claim 9, wherein the encoding rate of the encoder is greater than ½, and
the symbol mapper maps a part of the information bits and the redundancy bits on the first bits of the respective symbols, and maps the other part of the information bits on the second bits of the respective symbols.

13. The symbol mapping apparatus of claim 9, wherein the encoding rate of the encoder is less than ½, and
the symbol mapper maps a part of the redundancy bits and the information bits on the first bits of the respective symbols, and maps the other part of the redundancy bits on the second bits of the respective symbols.

14. A symbol mapping apparatus comprising: an encoder that encodes transmission data; a first interleaver that outputs a plurality of information bits by interleaving an information part from among the output from the encoder; a second interleaver that outputs a plurality of redundancy bits by interleaving a redundancy part from among the output from the encoder; and a symbol mapper that maps the information bits and the redundancy bits on the symbol according to the log likelihood ratio (LLR), wherein the symbol mapper allocates at least part of the information bits to the first bits of the respective symbols, and allocates at least part of the redundancy bits to the second bits of the respective symbols, wherein the first bits have an average LLR value that is less than that of the second bits, and wherein the encoder, first interleaver, second interleaver, and symbol mapper are incorporated in one or more processors.

15. The symbol mapping apparatus of claim 14, wherein the encoder includes a systematic encoder.

16. The symbol mapping apparatus of claim 14, wherein the encoder has an encoding rate of ½, and
the symbol mapper allocates the information bits to the first bits of the respective symbols, and allocates the redundancy bits to the second bits of the respective symbols.

17. The symbol mapping apparatus of claim 14, wherein the encoding rate of the encoder is greater than ½, and
the symbol mapper maps a part of the information bits and the redundancy bits on the first bits of the respective symbols, and maps the other part of the information bits on the second bits of the respective symbols.

18. The symbol mapping apparatus of claim 14, wherein the encoding rate of the encoder is less than ½, and
the symbol mapper maps a part of the redundancy bits and the information bits on the first bits of the respective symbols, and maps the other part of the redundancy bits on the second bits of the respective symbols.

* * * * *